(12) United States Patent
Bruton et al.

(10) Patent No.: US 11,634,820 B2
(45) Date of Patent: Apr. 25, 2023

(54) MOLDING COMPOSITE PART WITH METAL LAYER

(71) Applicant: The Boeing Company, Chicago, IL (US)

(72) Inventors: Eric A. Bruton, Lake St. Louis, MO (US); Christopher H. Childers, St. Charles, MO (US); Stephen P. Gaydos, St. Louis, MO (US)

(73) Assignee: THE BOEING COMPANY, Arlington, VA (US)

( * ) Notice: Subject to any disclaimer, the term of this patent is extended or adjusted under 35 U.S.C. 154(b) by 0 days.

(21) Appl. No.: 16/445,102

(22) Filed: Jun. 18, 2019

(65) Prior Publication Data

US 2020/0399763 A1 Dec. 24, 2020

(51) Int. Cl.
| | |
|---|---|
| *H05K 9/00* | (2006.01) |
| *C23C 24/04* | (2006.01) |
| *B64D 45/02* | (2006.01) |
| *C23C 28/02* | (2006.01) |
| *B29C 53/00* | (2006.01) |
| *B29K 105/00* | (2006.01) |

(52) U.S. Cl.
CPC ............. *C23C 24/04* (2013.01); *B64D 45/02* (2013.01); *C23C 28/023* (2013.01); *H05K 9/0088* (2013.01); *B29C 53/005* (2013.01); *B29K 2105/251* (2013.01); *B29K 2995/0011* (2013.01)

(58) Field of Classification Search
CPC ......... C23C 24/00; C23C 28/00; B64D 45/00; H05K 9/00; B32B 37/00; B29C 65/00
See application file for complete search history.

(56) References Cited

U.S. PATENT DOCUMENTS

| | | | | |
|---|---|---|---|---|
| 4,390,489 | A | * | 6/1983 | Segal ..................... B29B 11/04 264/126 |
| 4,769,270 | A | | 9/1988 | Nagamatsu et al. |
| 5,127,601 | A | | 7/1992 | Schroeder |
| 5,246,538 | A | * | 9/1993 | Johnson .................. B29C 59/02 156/155 |
| 5,302,414 | A | | 4/1994 | Alkhimov |
| 6,129,948 | A | | 10/2000 | Plummer |
| 7,354,354 | B2 | | 4/2008 | Palumbo |
| 8,119,531 | B1 | | 2/2012 | Arnold |
| 2004/0058064 | A1 | * | 3/2004 | Fuller ................... B05B 7/1486 427/180 |

(Continued)

OTHER PUBLICATIONS

"Preparation of metallic coatings on polymer matrix composites by cold spray", X.L. Zhou, A.F. Chen, J.C. Liu, X.K. Wu, J.S. Zhang, Surface & Coatings Technology 206 (2011) 132-136 (Year: 2011).*

(Continued)

*Primary Examiner* — David P Turocy
*Assistant Examiner* — Mohammad Mayy
(74) *Attorney, Agent, or Firm* — MH2 Technology Law Group LLP

(57) ABSTRACT

A method of molding a metalized composite part. The method comprises: introducing particles comprising at least one metal into a gas stream; directing the gas stream toward a surface of a thermoplastic composite part, thereby depositing a metal layer on the composite part to form a metallized composite part; and molding the metallized composite part to introduce a bend without delamination of the metal layer from the metallized composite part.

33 Claims, 7 Drawing Sheets

(56) References Cited

U.S. PATENT DOCUMENTS

| | | | | |
|---|---|---|---|---|
| 2006/0093736 | A1* | 5/2006 | Raybould | C23C 28/028 |
| | | | | 427/180 |
| 2006/0135282 | A1* | 6/2006 | Palumbo | C25D 7/00 |
| | | | | 473/316 |
| 2007/0175573 | A1* | 8/2007 | Fox | B29D 99/0007 |
| | | | | 156/196 |
| 2008/0145555 | A1* | 6/2008 | Kocik | B05D 1/08 |
| | | | | 427/451 |
| 2009/0029180 | A1 | 1/2009 | Oguri | |
| 2010/0040902 | A1 | 2/2010 | Mizrahi | |
| 2010/0119707 | A1* | 5/2010 | Raybould | C23C 24/04 |
| | | | | 427/185 |
| 2010/0304063 | A1 | 12/2010 | McCrea | |
| 2011/0039024 | A1* | 2/2011 | Jabado | C23C 24/04 |
| | | | | 427/201 |
| 2011/0135884 | A1 | 6/2011 | Lettow | |
| 2011/0159764 | A1* | 6/2011 | Price | B32B 15/08 |
| | | | | 156/308.2 |
| 2012/0037449 | A1 | 2/2012 | Ayle | |
| 2013/0095340 | A1* | 4/2013 | Sivakumar | C23C 4/134 |
| | | | | 428/548 |
| 2014/0141257 | A1 | 5/2014 | Ranade | |
| 2017/0165906 | A1 | 6/2017 | Alms | |
| 2019/0233946 | A1 | 8/2019 | Bruton | |
| 2020/0032010 | A1 | 1/2020 | Liao et al. | |
| 2020/0399763 | A1 | 12/2020 | Bruton | |

OTHER PUBLICATIONS

Che et al., "Meeetallization of carbon fibre reinforced polymers by cold spray," Surface & Coatings Technology 313 (2017) 236-247.
Notification Concerning Transmittal of International Preliminary Report on Patentability dated Aug. 13, 2020 in corresponding PCT Application No. PCT/US2019/015558, 10 pages.
Wikipedia "Thermal Spraying," author unknown, retrieved from "https://en.wikipedia.org/w/index.php?title=Thermal_spraying&oldid=89396788"5, last edited on Apr. 24, 2019, 8 pages.
Bruton et al., "Cold Spray Metallic Coating and Methods," U.S. Appl. No. 16/215,386, filed Dec. 10, 2018.
Che et al., "Metallization of carbon fibre reinforced polymers by cold spray," Surface & Coatings Technology 313 (2017) 236-247.
Tsipouridis, (Authorized Officer), International Search Report and Written Opinion dated Apr. 11, 2019 issued in related International Application No. PCT/US2019/015558 filed Jan. 29, 2019.
Extended European Search Report dated Jan. 26, 2021 in corresponding European Application No. 20180711.2, 12 pages.
Ganesan, A., et al., "Cold Spray Coating Deposition Mechanism on the Thermoplastic and Thermosetting Polymer Substrates," Journal of Thermal Spray Technology, ASM International, Dec. 2013 (revised Jul. 7, 2013), 22(8): 1275-1282, 8 pages.
Author Unknown, Thermacraft, "Electrical Resistance Heating Elements: An Overview," 2016, 30 pages.

* cited by examiner

MOLDING COMPOSITE PART WITH METAL LAYER

DETAILED DESCRIPTION

Field of the Disclosure

The present disclosure is directed to a process for molding a composite part with a metal layer.

Background

Metallization of flat composites is a difficult task and there are limited ways that composites have been metallized in the past. Curved composite parts are even more difficult to metalize. This is especially true when using a robot because movement in the Z-axis to accommodate the surface curvature is often limited.

Thus, there is a need in the art for novel materials and processes that can be used to form curved, metalized composite parts.

SUMMARY

The present disclosure is directed to a method of molding a metalized composite part. The method comprises: introducing particles comprising at least one metal into a gas stream; directing the gas stream toward a surface of a thermoplastic composite part, thereby depositing a metal layer on the composite part to form a metallized composite part; and molding the metallized composite part to introduce a bend without delamination of the metal layer from the metallized composite part.

The present disclosure is also directed to a method of imparting electrical EMI resistance or lightning protection to a thermoplastic composite part. The method comprises: introducing particles comprising at least one metal into a gas stream; directing the gas stream toward a surface of a thermoplastic composite part, thereby depositing a metal layer on the composite part to form a metallized composite part; and molding the metallized composite part to introduce a bend without delamination of the metal layer from the metallized composite part, wherein the metal layer imparts electrical EMI resistance or lightning protection to the thermoplastic composite part.

The present disclosure is further directed to a cold sprayed metal coated article. The cold sprayed metal coated article comprises: a thermoplastic composite part having at least one surface; and a cold sprayed metal layer present on the thermoplastic composite part, the cold sprayed metal layer having a deformation produced by molding the thermoplastic composite part together with the cold sprayed metal layer; optionally an electrochemical insulating layer disposed between the thermoplastic composite part and the cold sprayed metal layer; and optionally at least one additional metal layer, the at least one additional metal layer sandwiching at least a portion of the metal layer between the at least one additional metal layer and the thermoplastic composite part; the cold sprayed metal coated article having an increase in one or more properties chosen from EMI resistance, erosion protection, lightning protection, electromagnetic interference shielding, electromagnetic emission shielding and lightning strike protection compared to the same thermoplastic composite part without the cold sprayed metal layer.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrates aspects of the present teachings and together with the description, serve to explain the principles of the present teachings.

Figure 1:
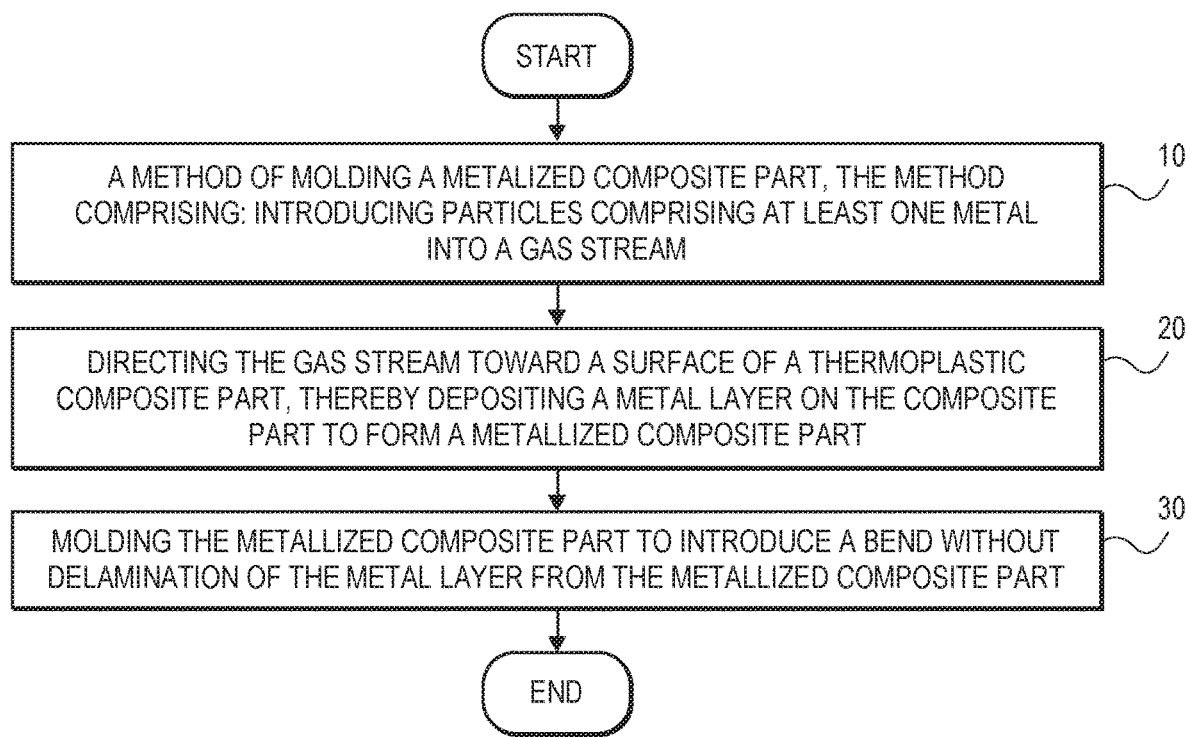
FIG. 1 is a flow chart for a process of metallizing a composite part, according to an example of the present disclosure.

It should be noted that some details of the figures have been simplified and are drawn to facilitate understanding rather than to maintain strict structural accuracy, detail, and scale.

DESCRIPTION

Reference will now be made in detail to the present teachings, examples of which are illustrated in the accompanying drawings. In the drawings, like reference numerals have been used throughout to designate identical elements. In the following description, reference is made to the accompanying drawings that form a part thereof, and in which is shown by way of illustration specific examples of practicing the present teachings. The following description is, therefore, merely exemplary.

The present disclosure is directed to a process for metallizing a flat surface of a composite part and then molding to introduce a bend to the composite part without delamination of the metal. The process allows production of metallized composite parts in a cost-effective manner. Forming metallized thermoplastic composite parts with complex geometry or curvature is possible.

The present disclosure is also directed to a process for imparting electromagnetic interference shielding, electromagnetic emission shielding, lightning strike protection, electrochemical interaction resistance, or combinations thereof to a surface of a composite part.

Method of Metallizing

The present disclosure is directed to a method of metallizing a composite part and then molding the metalized composite part. As shown at 10 and 20 of the flowchart of FIG. 1, the method comprises introducing particles comprising at least one metal into a gas stream and then directing the gas stream toward a surface of a thermoplastic composite part. In this manner a metal layer is deposited on the composite part to form a metallized composite part. In an example, the metal layer is formed on one or more flat surfaces of the composite part. For example, the metal layer can be formed entirely on one or more flat surfaces of the composite part. In an example, the metal layer covers the entirety of a major flat surface of the composite part, where "major flat surface" is defined as any flat surface that makes up about 20% to about 50% of the total outer surface area of the composite part prior to molding. In another example, the major flat surface can make up about 30% to about 50% of the total outer surface area of the composite part prior to molding. As shown at 30 of FIG. 1, the metallized composite part is molded to introduce a bend therein without delamination of the metal layer from the metallized composite part.

In this process, the particles comprising at least one metal are projected onto the surface of a thermoplastic composite part to form a metal layer by a process referred to herein as cold spraying. The resulting cold-sprayed metal layer has excellent adhesion with the thermoplastic composite part, and imparts one or more of electromagnetic interference shielding, electromagnetic emission shielding, or lightning strike protection to the thermoplastic composite part. The metal layer can be continuous on the surface of the thermoplastic composite part. The metal layer can be semi-continuous on the surface of the thermoplastic composite part. The metal layer can be patterned on the surface of the thermoplastic composite part using conventional masking techniques. Thus, the thermoplastic composite part with surface EMI resistance, erosion protection (e.g., from exposure to elements such as from rain, sleet and so forth), lightning protection or electrochemical interaction resistance is produced using a technique in which metal particles are projected directly onto the surface of the thermoplastic composite part, and a metal layer that exhibits excellent adhesion is provided.

Thermoplastic Composite Part

The thermoplastic composite part comprises a thermoplastic material and one or more filler materials. Examples of thermoplastic materials that can be used in accordance with the present disclosure include thermoplastic materials that act as a matrix in combination with one or more types of fiber fillers. In one example, materials useful for the practice of the present disclosure include fiber-reinforced plastics (FRP) comprising a thermoplastic material in combination with inorganic fibers such as carbon fibers, carbon nanotubes, graphite fibers, woven glass fibers, unwoven glass fibers, ceramic fibers, alumina fibers, boron fibers, metal fibers, such as elemental metal or metal alloy fibers, and metalized fibers, such as metal coated glass fibers, metal coated alumina fibers, or metal coated boron fibers. Other, non-fiber particles can also be employed in combination with or in place of any of the fibers discussed above, such as carbon particles, including graphite particles, metal particles, glass particles and so forth. In another example, the fiber reinforced plastic can comprise organic fiber such as a nylon fiber, or aramid fiber.

Examples of suitable thermoplastics include crystalline polymers, semi-crystalline polymers, amorphous polymers and mixtures thereof. Crystalline polymers provide high temperature resistance as well as chemical resistance to FRPs. Semi-crystalline polymers provide the benefits of crystalline polymers along with ductility and processing advantages to FRPs. Amorphous polymers provide for resiliency, ductility and processing advantages to FRPs.

Examples of suitable thermoplastic materials include epoxies, phenolics, polyesters, polyesters, ureas, melamines, polyamides, polyimides, poly-ether-ether-ketones (PEEK), poly-ether-ketone-ketones (PEKK), polyetherimides (PEI), polyphthalamides, polyphthalates, polysulfones, polyurethanes, chlorinated polymers, fluorinated polymers, polytetrafluoroethylene, polycarbonates, liquid crystal polymers, partially crystalline aromatic polyesters, and modified versions thereof. Any of these materials can include one or more fillers or reinforcement materials as described above.

In an example, the thermoplastic composite part comprises a carbon fiber reinforced plastic (CFRP), a glass fiber reinforced plastic (GFRP), or both. However, the present disclosure is not restricted to these types of materials, and articles formed from other types of reinforced thermoplastics can also be used in the presently disclosed process of the present disclosure.

Cold Spraying Process

The thermoplastic composite part to be cold sprayed can be subjected to a pretreatment to facilitate formation of the metal layer or an optional electrochemical insulating layer (described in greater detail below) on the thermoplastic composite part surface, for example, by roughening the surface of the thermoplastic composite part to provide an irregular surface topography. An irregular surface topography can result from various surface pretreatment methods, such as mechanical abrasion or etching. Such surface irregularities can contribute to a surface texture that influences bond strength between the metallic layer or optional electrochemical insulating layer and the substrate surface. Suitable examples of roughening the surface of the thermoplastic composite part include fine particle shot blasting, where fine particles can include one or more particle materials chosen from metals, ceramics and glass. The particles used in the shot blasting can be substantially spherical or contain edges. Other surface roughening methods may be used as known in the art.

In some examples, following completion of this optional surface roughness pretreatment, which may be used as desired to roughen the surface of the thermoplastic composite part, or optional electrochemical insulating layer, metallic particles are projected onto the surface of the thermoplastic composite part using a cold spraying method, so as to form a metal layer thereon. In another example, the cold sprayed metal layer conforms to the original surface roughness of the thermoplastic composite part surface, making the thermoplastic composite part surface amenable to painting and other fabrication. In another example, the cold sprayed metal layer is used in thermoplastic composite materials which are otherwise difficult to paint due to poor adhesion of paints to the surfaces of thermoplastic composite materials. The cold sprayed metal layer conforms to the original surface roughness of the thermoplastic composite surface, making the thermoplastic composite surface paintable. In another implementation, the metal layer provides UV protection to the thermoplastic composite part.

The cold spraying method is a technique in which metallic particles are heated to a temperature that is lower than the melting point or softening point of the metallic particles, and are then sprayed using a propellant gas, thereby causing the metallic particles to impinge into the substrate in a solid state, forming a coating or layer. Provided the collision velocity of the cold sprayed particles is greater than a certain fixed velocity (the critical velocity), the kinetic energy of the particles causes the particles to undergo a plastic deformation, enabling formation of the coating to start. This critical velocity varies depending on the metal or alloy used for the particles and the glass transition temperature of the substrate, as well as the particle size. In the present disclosure, the spray pressure of the above propellant gas is selected so that the collision velocity of the metal particles striking the thermoplastic composite part reaches a critical velocity associated with the metal used and the thermoplastic composite part substrate, and is typically set to a value ranging from about 100 psi to about 400 psi.

The heating temperature of the propellant gas comprising the metal particles is usually selected appropriately in accordance with the materials being used, and is typically set to a value ranging from about 100° C. to about 500° C. In one example, the gas flow uses a gas having a pressure ranging from about 100 psi to about 400 psi, so as to provide a temperature below the melting point of the metallic particles. In some examples the temperature ranges from about 100° C. to about 500° C. These conditions provide for efficient acceleration of the metallic particles, and reduces thermal and chemical effects on the substrate surface. For example, the gas stream has a temperature and pressure adjusted to prevent significant thermal softening or significant ablation of the surface of the substrate, which surface may comprise, for example, an electrochemical insulating layer or thermoplastic composite part. The term "significant" as used herein in the phrases "significant thermal softening" and "significant ablation" is defined to mean in amounts, or to a degree, that results in geometric distortion of the composite part or that otherwise undesirably affects the structural integrity of the composite part.

Readily available air or nitrogen can be used as the gas for forming a gas stream to reduce oxidative effects and reduce cost. The air or nitrogen makes it possible to regulate the velocity of metallic particles within a range of subsonic to supersonic velocity, e.g. from 300 to 1200 m/s. Controlling the velocity of particles can be achieved by heating the gas and also provides for regulation of the velocity of particles within wide limits.

An apparatus for carrying out the method for applying a coating can comprise a metering powder feeder having a casing incorporating a hopper for containing the metallic particles. In one example the hopper is formed as a drum having depressions in its cylindrical surface for metering the metallic particles and presenting the powder to a mixing chamber provided with a nozzle configured for accelerating the metallic particles. A source of compressed gas is connected to the mixing chamber. A metallic particle flow controller is operably connected to the cylindrical surface of the drum, providing a space that results in a desired flowrate of the particles. An intermediate nozzle can be connected to the mixing chamber that communicates, via an inlet pipe, with the source of compressed gas. In one example a CenterLine (Windsor) Limited system (Ontario, Canada), with robotics, is used as the cold spray apparatus.

The presently disclosed method provides for applying a conductive, metal coating or layer to the surface of a thermoplastic composite, such as a FRP. The particles are of a size of, for example, from 1 to 50 microns in an amount so as to provide a density of mass flow rate of the particles suitable for providing a continuous, non-continuous, or patterned metal layer on the substrate surface that is dense, and of a low volume of microvoids to optimize conductivity of the coating. The resultant metal layer is uniform, without phase transformations, and generally conformal to the surface roughness of the substrate. The resultant metal layers resist cracking, have metal like microhardness, and display sufficiently good cohesive and adhesive strength so as to avoid delamination from the thermoplastic composite during a subsequent molding process, which is described in greater detail below. A particle size of less than 1 micron is undesirable, as a stable spray state may not be achievable. If the particle size exceeds 50 micron, then uniform deposition of the particles becomes problematic.

In the present disclosure, comparatively soft metal particles (such as, for example, Mohs Hardness <4) can be used as the metal particles for cold spraying. In an example, the particles can comprise at least one metal that is chosen from aluminum, copper, gold, and silver. Examples of metals comprising aluminum, copper, gold and silver include elemental copper, elemental gold, elemental silver, elemental aluminum, or alloys of any of these primary metals with one or more other alloying metals, such as Si, Mg, Au, Ag, Cu, Al, and Zn, that are different than the chosen primary metal, and where the alloys exhibit the desired hardness and adhesion to thermoplastic composites such as FRPs. In one example, cold spraying using elemental aluminum or aluminum alloy particles is employed to form the metal layer on the thermoplastic composite part. Aluminum alloys can be any suitable alloys that provide the desired hardness and adhesion, including aluminum alloys that include one or more elements chosen from Cu, Si, Mg, Au, Ag, and Zn, such as, for example, 1100, 1199, 2000, 6000, and 7000 series aluminum alloys. For purposes of the present disclosure, the terms elemental aluminum, elemental copper, elemental gold, and elemental silver, are defined as respectively having an aluminum, copper, gold or silver content that is 99% by weight or greater. Thus, elemental aluminum is defined herein as being from 99% to 100% by weight pure aluminum.

The thickness of the resulting metal layer on the thermoplastic composite part can be any desired thickness. In an example, the thickness of the metal layer can be from about 0.01 mil to about 20 mils, such as about 0.05 mils to about 14 mils, or about 0.1 mil to about 5 mil, or about 0.1 mil to about 2 mil. A thickness of only 0.05 mils will enable paint to adhere to the metallized thermoplastic composite. A thickness of about 1 mils (25.4 microns) to 14 mils (356 microns) can provide a desired level of surface EMI resistance or lightning protection, electromagnetic interference shielding, electromagnetic emission shielding, or lightning strike protection. In an example where the thermoplastic composite part is used as an aircraft main wing structure that exhibits lightning resistance, the thickness of the metal layer can be, for example, not less than 1 mils (25.4 microns) and not more than 10 mils (254 microns), e.g., so as to not contribute unnecessarily to the weight of the structure. The metal layer keeps electrical charge on the conductive surface of the aircraft (e.g., in the metal layer) and away from the composite portion (e.g., carbon fiber or other material) of the of the composite part, thereby reducing the problems of edge glow. Reduced or no edge glow greatly reduces the danger from igniting fuel and help isolates electronics.

Figure 2:
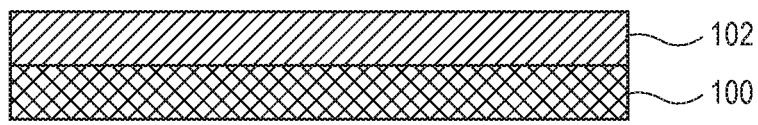
FIG. 2 illustrates a schematic cross-section of a metallized composite part prior to molding, according to an example of the present disclosure.

FIG. 2 illustrate an example of a metallized composite part comprising a thermoplastic composite part 100 as a substrate and a metal layer 102. Thermoplastic composite part 100 can comprise any of the thermoplastic materials listed above containing one or more of the listed fillers or reinforcement materials (e.g., a thermoplastic composite). Metal layer 102 can comprise any of the metals discussed herein for cold spraying. In one example, metal layer 102 is aluminum or an aluminum alloy. In one example, the thermoplastic composite part 100 is carbon fiber or glass fiber reinforced PEKK or carbon fiber or glass fiber reinforced PEEK.

Additional Metal Layer

In some examples, the present disclosure further comprises introducing an optional additional metal layer to at least a portion of the first cold sprayed metal layer. In one example, the additional metal layer is of a different metallic composition than that of the first cold sprayed metal layer. For example, the additional metal layer can be a cold sprayed or thermal sprayed coating on at least a portion of the cold sprayed first metal coating. In one aspect, the additional metal layer can be applied using, for example, chemical vapor deposition, atmospheric plasma deposition, metal melt deposition, or any other suitable deposition technique.

The additional metal layer can comprise, for example, at least one metal chosen from Ag, Al, Au, Co, Cr, Cu, Fe, Ni, Mo, Pd, Pt, Rh, Ru, Sn, Ti, W, Zn, and Zr. For example, the additional metal layer can be elemental metals selected from any one of Ag, Al, Au, Co, Cr, Cu, Fe, Ni, Mo, Pd, Pt, Rh, Ru, Sn, Ti, W, Zn, Zr, and alloys thereof (e.g., alloyed mixtures of any two or more of the above listed metals in this paragraph). In an example, the additional metal layer comprises cold sprayed or thermal sprayed elemental nickel or nickel alloy.

Figure 3:
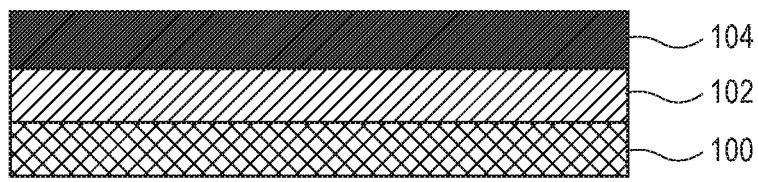
FIG. 3 illustrates a schematic cross-section of a metallized composite part prior to molding, according to an example of the present disclosure.

FIG. 3 shows a cross-sectional view of a metallized composite part comprising a thermoplastic composite part 100 having a metal layer 102 and an additional metal layer 104. Metal layer 102 and additional metal layer 104 can comprise any of the metals listed above for each of those layers. In one example, metal layer 102 is aluminum or an aluminum alloy and additional metal layer 104 is nickel. The thermoplastic composite part can comprise any of the materials described herein for use as a thermoplastic composite. In an example, the thermoplastic composite part 100 is carbon fiber or glass fiber reinforced PEKK or carbon fiber or glass fiber reinforced PEEK.

Electrochemical Insulating Layer

In any of the examples described herein, an electrochemical insulating layer can optionally be provided between the thermoplastic composite part surface and the cold spray deposited metal layer. Exemplary electrochemical insulating layer materials include non-conductive materials, such as fiberglass, polymers, and ceramics. Exemplary electrochemical insulating layer materials include, but are not limited to: non-conductive polymers (e.g., PEEK or PEKK) with or without fillers; nonconductive fiber-impregnated fabrics, polymers, and thermosets; or coatings containing nonconductive fiber-reinforcing materials, such as thermoplastic composites comprising any of the thermoplastic materials described herein as a matrix material and having electrically non-conductive fiber-reinforcing materials disposed in the matrix material. In one example the electrochemical insulating layer is impregnated fiberglass ($Si_xO_y$). In another example the electrochemical insulating layer is a metal-metal oxide composite such as aluminum-aluminum oxide (Al—$Al_2O_3$), or is titanium oxide ($TiO_2$), silicon oxy carbide ($SiO_xC_y$) and the like. In another example, the electrochemical insulating layer is a cemented carbide alloy, such as tungsten carbide cobalt nickel alloy (WC—Co—Ni). In one aspect, the electrochemical insulating layer can be applied to the thermoplastic composite part surface using, for example, chemical vapor deposition, atmospheric plasma deposition, metal melt deposition, or by way of curable glass fiber or other nonconductive fiber-reinforced thermosets, paints, or coatings, or by any other suitable deposition technique.

Figure 4:
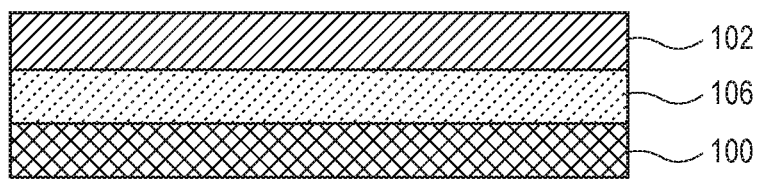
FIG. 4 illustrates a schematic cross-section of a metallized composite part prior to molding, according to an example of the present disclosure.

FIG. 4 shows a cross-sectional view of a metallized thermoplastic composite comprising a thermoplastic composite part 100 having an electrochemical insulating layer 106 disposed thereon. The electrochemical insulating layer 106 can comprise any of the electrochemical insulating materials described herein. A metal layer 102 is disposed on the electrochemical insulating layer 106. Metal layer 102 can comprise any of the metals described herein for deposition by cold spray techniques. The thermoplastic composite part 100 can comprise any of the thermoplastic composite materials described herein. In an example, the thermoplastic composite part 100 comprises carbon fiber or glass fiber reinforced PEKK or carbon fiber or glass fiber reinforced PEEK, the electrochemical insulating layer 106 is a fiberglass (or curable glass fiber reinforced thermoset), or paint, and the metal layer 102 is elemental aluminum or aluminum alloy.

Figure 5:
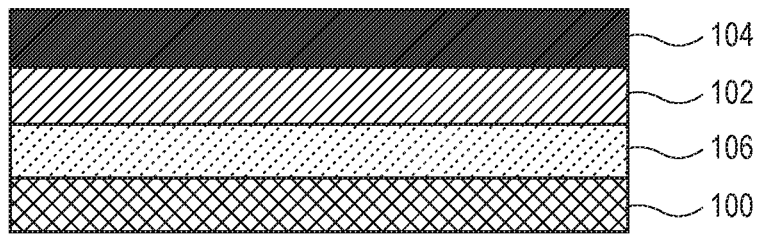
FIG. 5 illustrates a schematic cross-section of a metallized composite part prior to molding, according to an example of the present disclosure.

FIG. 5 shows a cross-sectional view of a metallized thermoplastic composite comprising a thermoplastic composite part 100, an electrochemical insulating layer 106, a cold sprayed metal layer 102, and a additional metal layer 104. Any of the materials disclosed herein for use as the thermoplastic composite part 100, electrochemical insulating layer 106, cold sprayed metal layer 102, and additional metal layer 104 can be employed. In an example, the thermoplastic composite part 100 is fiber reinforced PEKK or fiber reinforced PEEK, electrochemical insulating layer 106 is a fiberglass, the metal layer 102 is elemental aluminum or aluminum alloy, and the additional metal layer 104 is nickel. In another example, the thermoplastic composite part 100 is carbon fiber or glass fiber reinforced PEKK or carbon fiber or glass fiber reinforced PEEK, the electrochemical insulating layer 106 is a fiberglass (or curable glass fiber reinforced thermoset), carbon or glass fiber fabric impregnated with epoxy, or nonconductive paint, the metal layer 102 is elemental aluminum or aluminum alloy, and the additional metal layer 104 is nickel.

Figure 6:
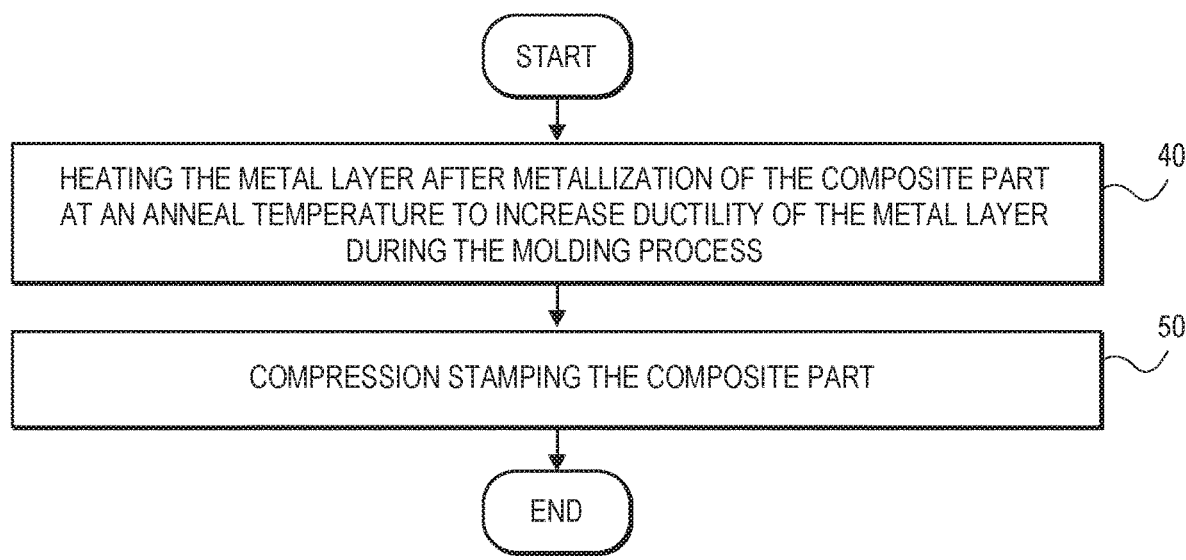
FIG. 6 illustrates a flowchart of a molding process, according to an example of the present disclosure.

After metallizing the composite part, as shown, for example, in FIGS. 2 to 5, the process of the present disclosure includes molding the metallized composite part to introduce a bend, as shown at 30 of FIG. 1. Referring to 40 of FIG. 6, the molding process includes heating the metallized composite part to soften the thermoplastic composite and to optionally increase ductility of the cold sprayed metal layer and/or the additional metal layer prior to molding. The composite part is then shaped, such as by compression molding (sometimes referred to as compression stamping) to introduce the bend, as shown at 50 of FIG. 6. Other techniques for shaping the composite could be employed.

In an example, the heating of the metallized thermoplastic composite part can be carried out at any temperature that will allow sufficient softening of the composite part for molding, while not significantly degrading the thermoplastic composite. The heating can also be employed at a sufficiently high temperature and for a sufficiently long time period so as to increase the ductility of the metal layer compared to the ductility of the metal layer prior to anneal. In this manner, cracking of the metal layer during molding can be reduced or eliminated. As an example, the heating can be carried out at an anneal temperature ranging from about 315° C. to about 400° C., such as about 345° C. to about 390° C., or about 360° C. to about 380° C. Temperatures higher than 400° C. can be employed if the thermoplastic material can withstand the temperatures without degrading. The anneal temperature for heating the metallized composite part is maintained for a period of time ranging from about 30 seconds to about 30 minutes, such as about 1 minute to about 20 minutes or about 2 minutes to about 10 minutes. Heating can be carried out using any suitable heating technique, such as, for example using an oven (e.g., infrared oven or other), using a laser or induction heating.

Other methods for increasing ductility of the metal layer and/or to otherwise prevent cracking of the metal layer during the molding process can also be employed. For example, the method can further comprise heating the particles comprising at least one metal (sometimes referred to herein as "metal particles") that are used for the cold spray process prior to the depositing of the metal layer 102. The heating of the metal particles can take place at any temperature that will increase ductility of the metal. Examples of such anneal temperatures range from about 315° C. to about 500° C., such as about 340° C. to about 450° C., or about 350° C. to about 400° C. for a time period ranging from about 30 seconds to about 30 minutes, such as about 1 minute to about 20 minutes or about 2 minutes to about 10 minutes. Still other methods of preventing or repairing cracking of metal layer 102 can include post anneal of the metal after molding, choosing sufficiently ductile metals for the metal particles, adjusting the thickness of the metal layer to account for thinning of the metal layer during molding, employing a less aggressive molding process and/or increasing the radius of curvature of a bend achieved during molding resulting part and so forth.

Figure 7:
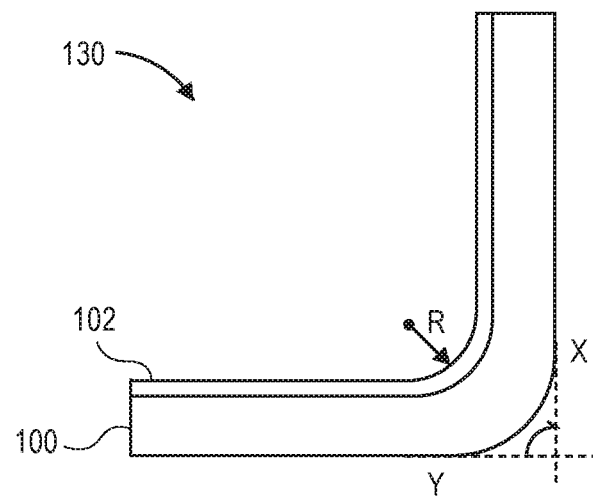
FIG. 7 shows a schematic cross-section of a metallized composite part after molding, according to an example of the present disclosure.
Figure 8:
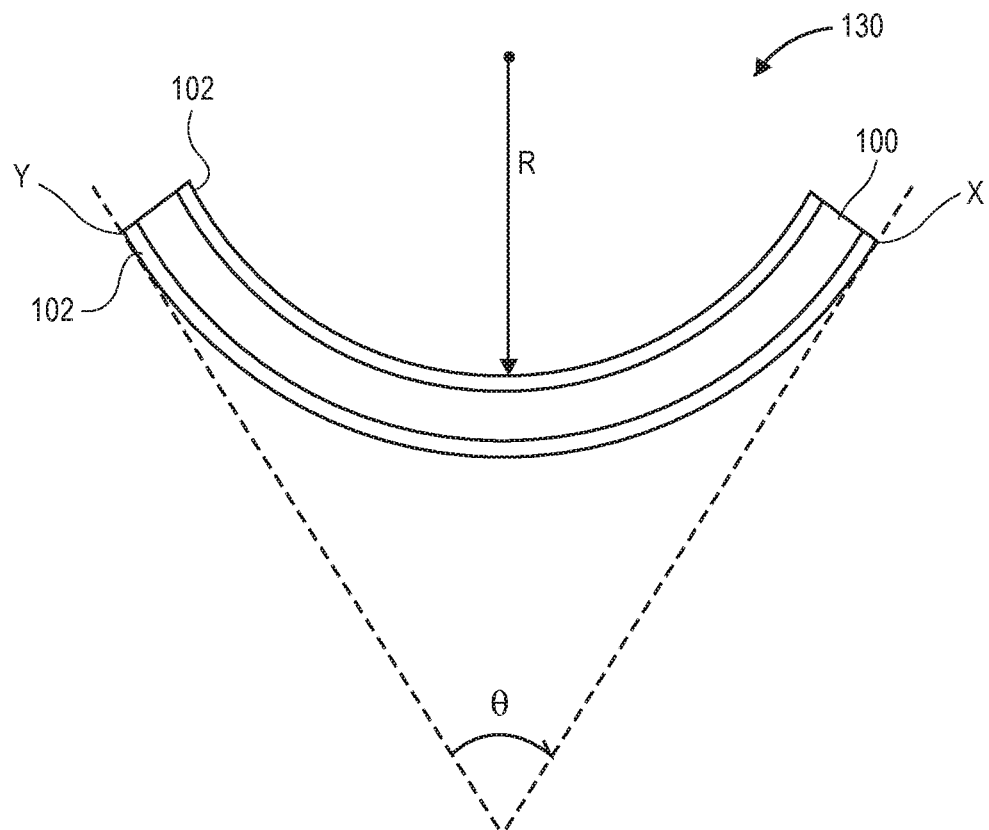
FIG. 8 shows a schematic cross-section of a metallized composite part after molding, according to an example of the present disclosure.

FIGS. 7 and 8 show examples of metalized composite parts 130 after molding has occurred. The molding process can impart a curve to the composite part having any desired radius of curvature, R, where the radius of curvature for any molded, metalized composite part 130 is measured at a given point on the surface of the molded, metalized composite part 130 with the smallest radius of curvature at which the metal layer 102 is formed, the radius of curvature, R, being defined as the radius of a circle which touches the surface of the molded, metalized composite part 130 at the given point and has the same tangent and curvature at that point. Example ranges for a radius of curvature include from 100 meters to 1 mm, or 50 meters to 0.5 cm, or 10 meters to 1 cm, or 5 meters to 1 cm. In some instances, it may be desirable to choose a larger radius of curvature to avoid forming defects in the metal layer 102 during molding. For example, a radius of curvature ranging from about 100 meters to about 0.5 cm, or 100 meters to about 1 cm, or about 100 meters to about 2, or about 100 meters to about 4 cm, may be desirable. The curved surface can include a single radius of curvature or be more complex, such as a surface including many bends with many different radii of curvatures.

The metalized composite part can be molded to include a bend of any desired angle, e, where the angle is measured relative to two points on the surface of the molded, metalized composite part 130 at which lines tangent to those points have the smallest angle of intersection for the molded, metalized composite part 130. Examples of such tangent lines are shown as dashed lines that are tangent at points X and Y in FIGS. 7 and 8, where the locations of X and Y are chosen because they result in the smallest value for e. The angle, e, can range, for example from 0° to less than 180°, or about 5° to about 175°, or about 15° to about 165°, or about 30° to about 150°, or about 45° to about 135°, or about 60° to about 120°.

Figure 13:
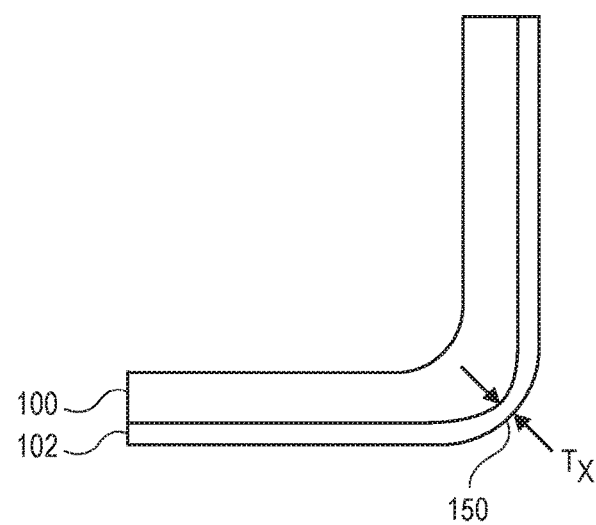
FIG. 13 shows a schematic cross-section of a metallized composite part having a deformation region after molding, according to an example of the present disclosure.

An implementation of the present disclosure is directed to a molded, cold sprayed metal coated article, such as those illustrated in FIGS. 7 and 8. The article comprises a thermoplastic composite part 100 having at least one surface. A metal layer 102, which has been depositing by a cold spraying process, is present on the thermoplastic composite part 100. The metal layer 102 can have a deformation 150 (FIG. 13), such as variation in layer thickness at the bend, or an increase or decrease in thickness of the metal layer produced by molding the thermoplastic composite part 100 together with the metal layer 102. For example, the thickness, Tx, of metal layer 102 at deformation 150 formed during molding can be thinner than the thickness of the metal layer 102 at that same point prior to molding. The thickness, Tx, at the bend may also be different (e.g., thinner or thicker) than at portions of the metal layer that are not bent during molding, as can also be seen from FIG. 13.

Optionally an electrochemical insulating layer, as described herein above, is disposed between the thermoplastic composite part 100 and the metal layer 102. The article also optionally includes at least one additional metal layer, as also described above, where at least a portion of the metal layer 102 is sandwiched between the at least one additional metal layer and the thermoplastic composite part 100. The cold sprayed metal coated article has an increase in one or more properties chosen from EMI resistance, erosion protection, lightning protection, electromagnetic interference shielding, electromagnetic emission shielding, and lightning strike protection compared to the same thermoplastic composite part without the cold sprayed metal layer.

Figure 9:
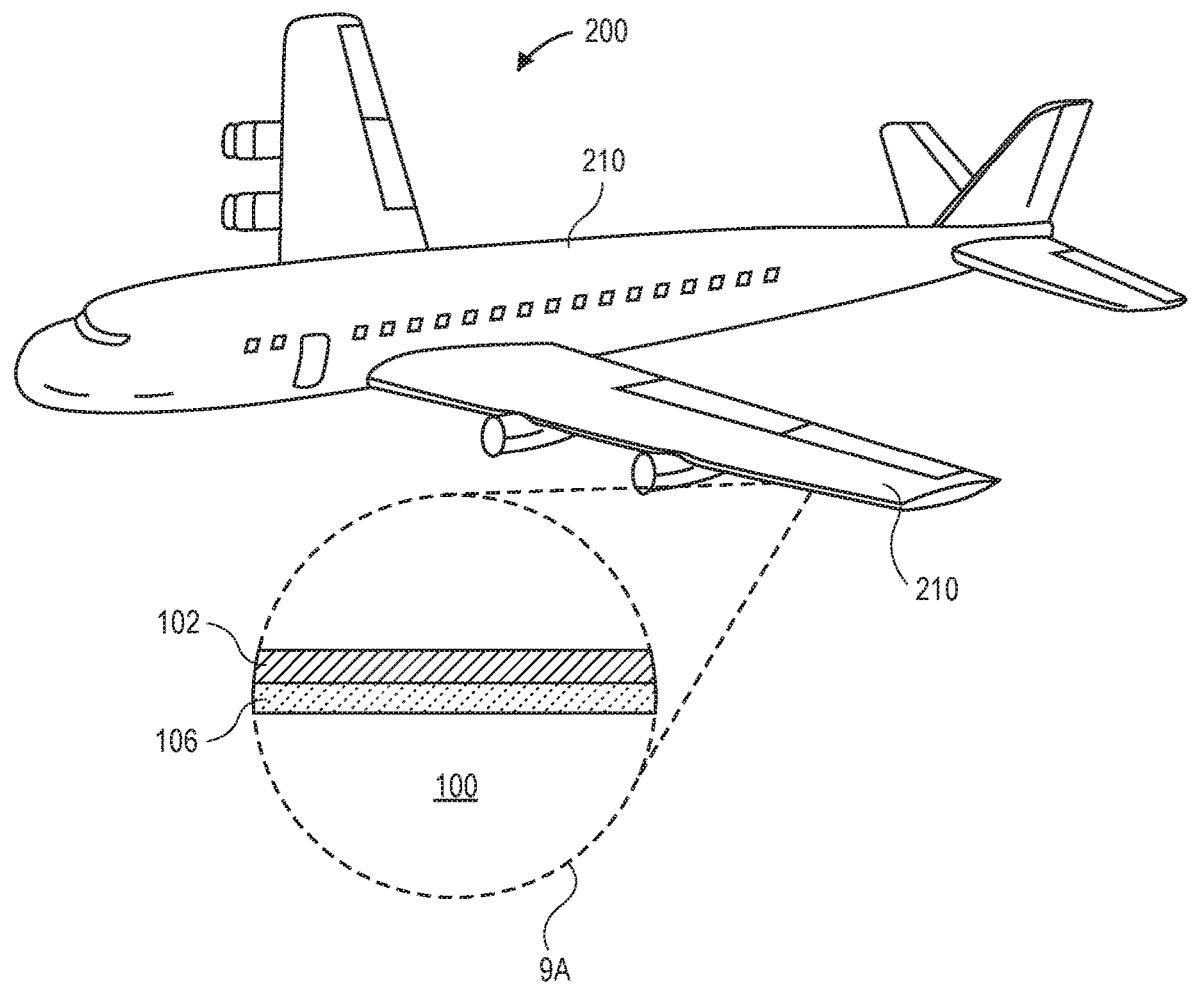
FIG. 9 shows a perspective view of an aerospace vehicle comprising a molded, metalized composite part, according to an example of the present disclosure.

In an example, the thermoplastic composite part as described herein is a component or part of an aerospace vehicle. In an example the application of the presently disclosed process is directed to an external surface of aerospace vehicle. With reference to FIG. 9, an application of the presently disclosed method is shown on an aerospace vehicle 200, whereby a vehicle substrate surface comprised of a thermoplastic composite part, such as, for example, FRP, is subjected to the presently disclosed method. Exploded view 9A is shown having vehicle substrate surface 210 with electrochemical insulating layer 106 and metallic coating or layer 102 disposed on a thermoplastic composite part 100 so as to impart electrical EMI resistance or lightning protection, erosion protection, electromagnetic interference shielding, electromagnetic emission shielding, or lightning strike protection to the surface of the polymer as well as galvanic and electrochemical interaction resistance between the cold sprayed metal and the thermoplastic composite part. Alternatively, any of the combination of layers as described for FIGS. 2, 3 and 5 could be employed in place of the layers illustrated in exploded view 9A.

The process and resulting composites of the present disclosure are not limited to aerospace applications. Rather, the process and composites can be used in any other application for which metalized composite parts may be employed. Example applications include parts for automobiles, trains and marine vehicles (e.g, composite parts for boats and boat hulls).

EXAMPLES

Example 1—Compression Stamping Cold Sprayed Panel

Figure 10:
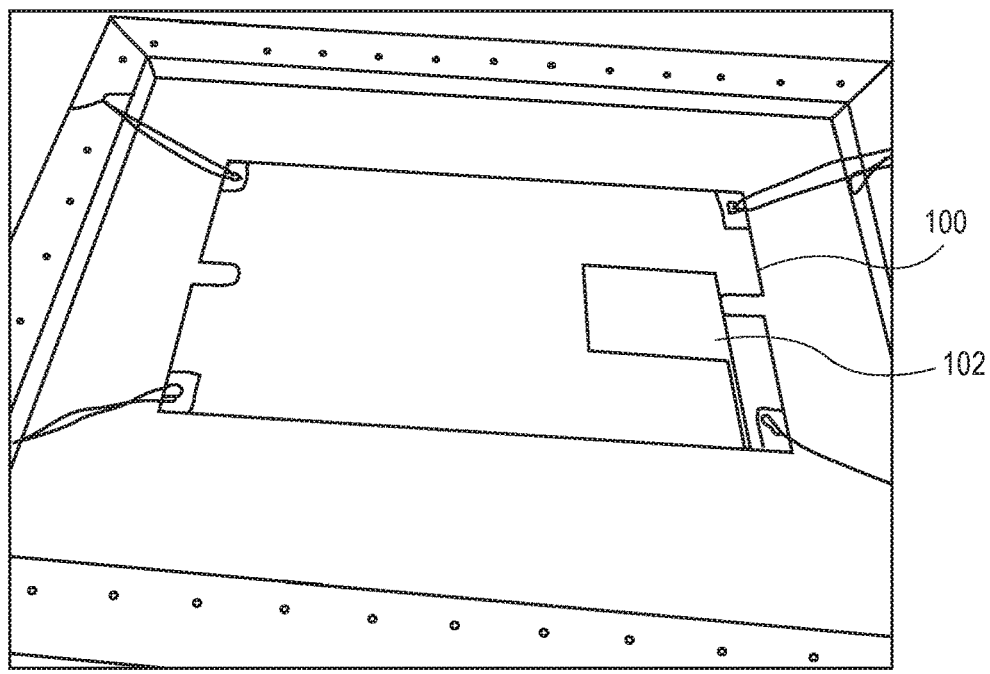
FIG. 10 shows a perspective top view of the sprayed aluminum layer on one major surface of the composite panel prior to molding, according to an example of the present disclosure.

Aluminum was cold sprayed onto a 2 foot by 1 foot, flat thermoplastic composite panel using the conditions set forth in Table 1 below. The thermoplastic composite panel included 2 plies of fiberglass PEKK BMS8-399 and BMS8-429. A metal layer 102 of aluminum having an area about 4 inches by 6 inches was deposited on both sides of the panel by the cold spray process. FIG. 10 shows the sprayed aluminum layer on one side of the composite panel.

TABLE 1

Conditions Used to Cold Spray Al on Panel

| | |
|---|---|
| Powder Equip Model & Ser # | Model AT-1200, Serial # RPFT 100493 |
| Powder Feeder Gas Supply | Air at 90 to 100 psig |
| Powder Feeder Pressure | 80 psig |
| Powder Feed Gas Flow Rate | 22 SCFH at 80 psig |
| Powder Wheel Size | 320 holes |
| Powder Feed Rate | SST Hopper #3 Feed % = 20% (10% = 2.0 rpm/2.1 gpm, 15% = 4.7 rpm/4 gpm, 20% = 7.4 rpm/8.7 gpm) |
| SST Spray Gun Set-Up | Centerline SST |
| Spray Gun Nozzle | Stainless Steel Nozzle |
| Gun Type (Manual or Robot) | Robot Gun |
| Spray Gun Nozzle Distance | 0.5 to 1.0 inch |
| Traversing Speed | 100 mm/sec |
| Step Increment | 2 mm |
| Spray Gun Gas Supply | Wind tunnel air |
| Gun Pressure | 200 psig |
| Gun Temperature | 350° C. |
| Preheat Method | None |
| Target Deposit Thickness | ~2-4 mils |
| Number of Passes | one as required to obtain deposit thickness. |
| Method of Cooling | None |

The panel with a metal layer 102 comprising elemental aluminum on both major surfaces went through an 8 min cycle in an Infrared (IR) oven, but would only have spent approximately 2.5 minutes in the melt zone of 360-380° C. It was then transferred to a 240° C. tool in which it was compression stamped. The compression stamping included holding it for 4 minutes under 600 psi.

Figure 11:
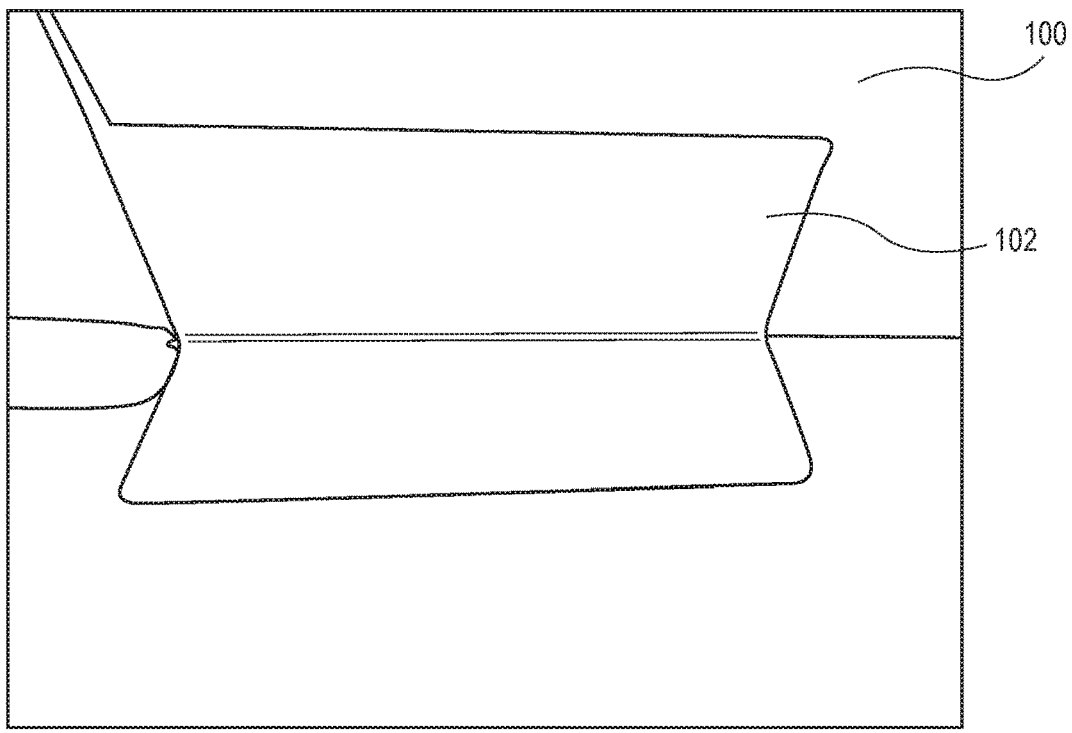
FIG. 11 shows a perspective top view of the sprayed aluminum layer on a concave major surface of the composite panel of FIG. 10 subsequent to molding, according to an example of the present disclosure.
Figure 12:
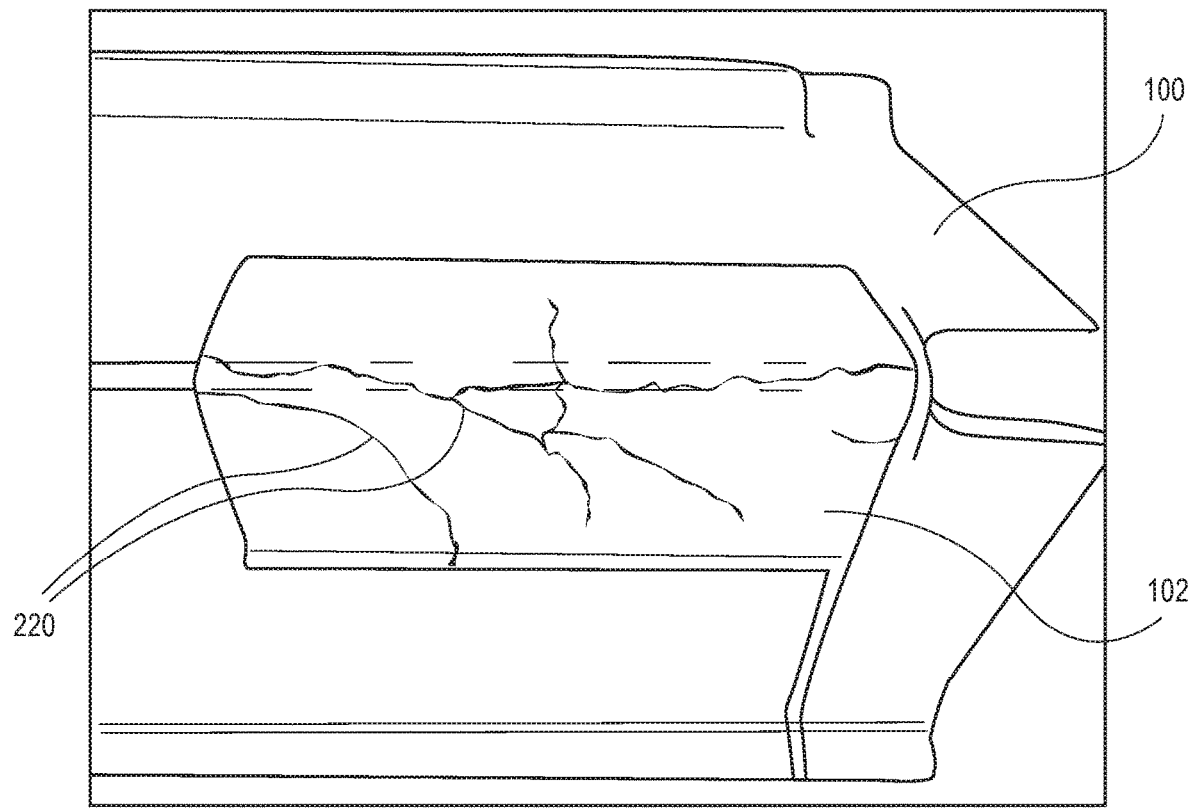
FIG. 12 shows a perspective top view of the sprayed aluminum layer on a convex major surface of the composite panel of FIG. 10 subsequent to molding, according to an example of the present disclosure.

The resulting stamped panel is shown in FIGS. 11 and 12. As shown in FIG. 11, the metal layer 102 on the inside of the bend showed no signs of defects, bunching or pealing, which is remarkable. As shown in FIG. 12, the metal layer 102 on the outside of the bend showed separation cracking 220 due to the elongation of the metal over a tight bend radius, but there was no delamination of the metal. With further optimization of the mold conditions or annealing techniques to improve aluminum ductility, the metal coating on the outside of the bend could be made to allow the metal to stretch with the thermoplastic composite without cracking. Also, it would be much easier for the metal on the outside of the bend to survive with a larger radius bend.

The ability to mold a composite with a pure metal or metal alloy coating is significant. Often dissimilar materials lose their bond to each other or break during such molding processes. That the metal coating survived without delamination is remarkable.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the intended purpose described herein. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. A method of molding a metallized composite part, the method comprising:
    disposing an electrochemical insulating layer comprising poly-ether-ether-ketone (PEEK), poly-ether-ketone-ketone (PEKK), or a combination thereof, onto a surface of a thermoplastic composite part;
    introducing particles comprising at least one metal into a gas stream, the particles being at a temperature that is lower than the melting point of the particles;
    directing the gas stream toward a surface of the thermoplastic composite part, thereby cold spraying a metal layer on the composite part to form the metallized composite part;
    after forming the metallized composite part, heating the metal layer at an anneal temperature ranging from about 315° C. to about 400° C., the anneal temperature being maintained for a period of time ranging from about 30 seconds to about 30 minutes so as to increase ductility of the metal layer compared to the ductility of the metal layer prior to the heating; and
    molding the metallized composite part to introduce a bend without delamination of the metal layer from the metallized composite part, wherein the heating occurs prior to the molding; and
    wherein the electrochemical insulating layer is between the thermoplastic composite part and the metal layer.

2. The method of claim 1, wherein the at least one metal is chosen from aluminum, copper, gold, and silver.

3. The method of claim 2, further comprising coating onto the metal layer at least one additional metal layer that is different from the metal layer, wherein the at least one additional metal layer comprises at least one metal chosen from Ag, Al, Au, Co, Cr, Fe, Ni, Mo, Pd, Pt, Rh, Ru, Sn, Ti, W, Zn, and Zr.

4. The method of claim 3, wherein an electrochemical insulating layer is disposed between the thermoplastic composite part and the metal layer.

5. The method of claim 1, wherein the thermoplastic composite part comprises a thermoplastic and one or more filler materials.

6. The method of claim 5, wherein the one or more filler materials are chosen from carbon nanotubes, inorganic fibers, carbon fibers, graphite fibers, woven glass fibers, unwoven glass fibers, ceramic fibers, alumina fibers, boron fibers, metal fibers, metalized fibers, metal coated glass fibers, metal coated alumina fibers, metal coated boron fibers, carbon particles, graphite particles, metal particles, glass particles, organic fibers and combinations thereof.

7. The method of claim 1, wherein the metal layer imparts electrical EMI resistance or lightning protection, erosion protection, electromagnetic interference shielding, electromagnetic emission shielding, or lightning strike protection to the metalized composite part.

8. The method of claim 1, further comprising heating the particles prior to the cold spraying of the metal layer at an anneal temperature ranging from about 315° C. to about 400° C. to increase ductility of the metal layer.

9. The method of claim 1, wherein the metal layer has a thickness ranging from about 0.01 mil to about 20 mils.

10. The method of claim 1, wherein the metal layer allows the composite to be paintable.

11. The method of claim 1, wherein the metal layer provides UV protection to the thermoplastic composite part.

12. The method of claim 1, further comprising cold spray coating or thermal spray coating onto the metal layer at least one additional metal layer different from the metal layer.

13. The method of claim 12, wherein the at least one additional metal layer comprises at least one metal chosen from Ag, Al, Au, Co, Cr, Cu, Fe, Ni, Mo, Pd, Pt, Rh, Ru, Sn, Ti, W, Zn, and Zr.

14. The method of claim 1, wherein the gas stream has a temperature and pressure adjusted to prevent significant thermal softening or significant ablation of the surface of the electrochemical insulating layer.

15. The method of claim 1, wherein the metal layer has a thickness ranging from 4 mils to about 20 mils.

16. The method of claim 1, wherein the metallized composite part is molded while the metallized composite part is at the anneal temperature.

17. The method of claim 1, further comprising attaching the molded metallized composite part to an exterior of a wing of an aircraft, and wherein the metal layer isolates an electrical charge from a lightning strike from the thermoplastic composite part, thereby preventing edge glow.

18. The method of claim 1, wherein an electrochemical insulating layer is positioned between the thermoplastic composite part and the metal layer, and further comprising attaching an additional metal layer on the metal layer, wherein the metal layer comprises aluminum, and wherein the additional metal layer comprises nickel.

19. The method of claim 1, further comprising heating the metal layer at an anneal temperature after molding.

20. A method of imparting electrical EMI resistance or lightning protection to a thermoplastic composite part, the method comprising:

disposing an electrochemical insulating layer comprising poly-ether-ether-ketone (PEEK), poly-ether-ketone-ketone (PEKK), or a combination thereof, onto a surface of the thermoplastic composite part;

introducing particles comprising at least one metal into a gas stream, the particles being at a temperature that is lower than the melting point of the particles;

directing the gas stream toward a surface of a thermoplastic composite part, thereby cold spraying a metal layer on the composite part to form a metallized composite part;

after forming the metallized composite part, heating the metal layer at an anneal temperature ranging from about 315° C. to about 400° C., the anneal temperature being maintained for a period of time ranging from about 30 seconds to about 30 minutes so as to increase ductility of the metal layer compared to the ductility of the metal layer prior to the heating; and molding the metallized composite part to introduce a bend without delamination of the metal layer from the metallized composite part, wherein the electrochemical insulating layer is between the thermoplastic composite part and the metal layer, wherein the heating of the metal layer occurs prior to the molding, and wherein the metal layer imparts electrical EMI resistance or lightning protection to the thermoplastic composite part.

21. The method of claim 20, wherein the metal layer comprises at least one metal chosen from aluminum, copper, gold, and silver.

22. The method of claim 21, further comprising coating onto the metal layer at least one additional metal layer that is different from the metal layer, wherein the at least one additional metal layer comprises at least one metal chosen from Ag, Al, Au, Co, Cr, Fe, Ni, Mo, Pd, Pt, Rh, Ru, Sn, Ti, W, Zn, and Zr.

23. The method of claim 22, wherein an electrochemical insulating layer is disposed between the thermoplastic composite part and the metal layer.

24. The method of claim 20, further comprising heating the particles prior to the cold spraying of the metal layer at an anneal temperature ranging from about 315° C. to about 400° C. to increase ductility of the metal layer.

25. The method of claim 24, wherein the heating of the metal layer occurs prior to the molding of the metal layer.

26. The method of claim 25, wherein the anneal temperature is maintained for a period of time ranging from about 2 minutes to about 30 minutes.

27. The method of claim 20, wherein the thermoplastic composite part comprises a thermoplastic and one or more filler materials.

28. The method of claim 27, wherein the one or more filler materials are chosen from carbon nanotubes, inorganic fibers, carbon fibers, graphite fibers, woven glass fibers, unwoven glass fibers, ceramic fibers, alumina fibers, boron fibers, metal fibers, metalized fibers, metal coated glass fibers, metal coated alumina fibers, metal coated boron fibers, carbon particles, graphite particles, metal particles, glass particles, organic fibers and combinations thereof.

29. The method of claim 20, wherein the anneal temperature ranges from about 345° C. to about 400° C.

30. The method of claim 20, wherein the metal layer has a thickness ranging from about 1 mil to about 20 mils.

31. The method of claim 20, further comprising cold spray coating or thermal spray coating onto the metal layer at least one additional metal layer different from the metal layer.

32. The method of claim 20, wherein an electrochemical insulating layer is disposed between the thermoplastic composite part and the metal layer.

33. The method of claim 20, wherein the metal layer has a thickness ranging from 4 mils to about 20 mils.

\* \* \* \* \*